US 8,441,830 B2

(12) United States Patent
Gravez et al.

(10) Patent No.: US 8,441,830 B2
(45) Date of Patent: May 14, 2013

(54) MANUFACTURING METHOD FOR STACKING MEMORY CIRCUITS AND FOR ADDRESSING A MEMORY CIRCUIT, CORRESPONDING STACKING AND DEVICE (75) Inventors: Pierre Gravez, Nogent Sur Marne (FR); Michel Thill, Les Clayes Sous Bios (FR)

(73) Assignee: Gemalto SA, Meudon (FR)

( * ) Notice: Subject to any disclaimer, the term of this patent is extended or adjusted under 35 U.S.C. 154(b) by 379 days.

(21) Appl. No.: 12/919,799

(22) PCT Filed: Feb. 23, 2009

(86) PCT No.: PCT/EP2009/052121
§ 371 (c)(1),
(2), (4) Date: Aug. 27, 2010

(87) PCT Pub. No.: WO2009/112354
PCT Pub. Date: Sep. 17, 2009

(65) Prior Publication Data
US 2011/0002153 A1 Jan. 6, 2011

(30) Foreign Application Priority Data
Mar. 7, 2008 (EP) .................................. 08305050

(51) Int. Cl.
*G11C 5/02* (2006.01)
(52) U.S. Cl.
USPC .............................. 365/51; 365/96; 365/201
(58) Field of Classification Search ............. 365/51, 365/96, 201
See application file for complete search history.

(56) References Cited

U.S. PATENT DOCUMENTS

| 6,081,910 A * | 6/2000 | Mifsud et al. ............... 714/718 |
| 6,239,495 B1 | 5/2001 | Sakui et al. |
| 6,624,506 B2 * | 9/2003 | Sasaki et al. ............... 257/686 |
| 6,742,107 B2 * | 5/2004 | Jinzaki ....................... 712/200 |
| 2001/0045645 A1 | 11/2001 | Sasaki et al. |
| 2007/0165461 A1 | 7/2007 | Cornwell et al. |
| 2010/0002512 A1 | 1/2010 | Cornwell et al. |

FOREIGN PATENT DOCUMENTS

| EP | 1 736 994 A1 | 12/2006 |
| EP | 1 811 525 A2 | 7/2007 |

OTHER PUBLICATIONS

*International Search Report (PCT/ISA/210) for PCT/EP2009/052121 dated Jun. 17, 2009.
*Written Opinion (PCT/ISA/237) for PCT/EP2009/052121 dated Jun. 17, 2009.

* cited by examiner

*Primary Examiner* — Son Dinh
*Assistant Examiner* — Nam Nguyen
(74) *Attorney, Agent, or Firm* — Buchanan Ingersoll & Rooney PC

(57) ABSTRACT

The invention relates to a method for making a stack of memory circuits, wherein the method includes the step of testing the validity of at least two memory circuits. According to the invention, the method includes the phase of configuring each memory circuit, the configuration phase including the step of writing, within a configuration device of each memory circuit included in the stack, a piece of information on an identifier allocated to the memory circuit in the stack, and a piece of information on the results of the validity test of the memory circuit. The invention also relates to a method for addressing a memory circuit, to a stack of memory circuits, and to an electronic device including such a stack.

18 Claims, 2 Drawing Sheets

MANUFACTURING METHOD FOR STACKING MEMORY CIRCUITS AND FOR ADDRESSING A MEMORY CIRCUIT, CORRESPONDING STACKING AND DEVICE

TECHNICAL FIELD OF THE INVENTION

The present invention concerns a method for making a stack of memory circuits.

The present invention also relates to a stack of memory circuits.

The present invention also relates to a method for addressing a memory circuit within a stack of memory circuits.

Such a stack of memory circuits can be used in many electronic devices, among which can be cited in particular electronic objects (or tokens) such as chip cards, USB (universal serial bus) keys, and dongles.

Finally, the present invention concerns a corresponding electronic device.

PRIOR ART

Using, as a memory, a stack of memory chips or memory circuits is known, where the memory capacity corresponds to the sum of the individual capacities relating to the various memory circuits included within the stack.

Accessing a memory circuit in the stack from a microprocessor or a logic unit external to the stack is also known, in order either to write a new data item to be stored or to read a data item stored within the memory circuit in the selected stack.

The document EP 1 736 994 describes a solution for selecting a memory circuit among the memory circuits of the stack.

To select a memory circuit, it is proposed to add several additional memory bits. The additional memory bits are particular to an input of a memory circuit relating to a selection of the memory circuit called "Chip Select". The "Chip Select" inputs of the various memory circuits are all electrically connected to one another. A specific value is attributed to the "Chip Select" input of each memory circuit. Each memory circuit is then identified among all the memory circuits, in a logic manner, by virtue of the specific value attributed to its "Chip Select" input.

DISCLOSURE OF THE INVENTION

The invention aims to provide an alternative solution to the solution of the prior art described above.

More particularly, the invention is a method for making a stack of memory circuits. The method comprises a step of testing the validity of at least two memory circuits.

According to the invention, the method comprises a phase of configuring at least one memory circuit, the configuration phase comprising a step of writing, within a configuration device of each memory circuit included within the stack, an item of information relating to an identifier attributed to the memory circuit within the stack and an item of information relating to a result of the memory circuit validity test.

The general principle of the invention is based on a marking of each memory circuit in order to distinguish one memory circuit among several within the stack and to know its state of validity in operation before any use thereof.

In this way, during a configuration mode, a memory circuit making up a stack is individually marked within a distinct part of the memory proper of the memory circuit. Then, in an operating mode, each memory circuit in the stack identified by its marking is recognised as being valid or non-valid in operation.

The expression "memory circuit validity test" concerns the "memory" part of the memory circuit used for storing one or more data items coming from outside.

It will be understood that such a manufacturing method makes it possible to give physical and logic access to any memory circuit forming part of a stack for any subsequent use thereof.

The method of making according to the invention a stack of memory circuits proposes a solution of selecting one memory circuit among all the memory circuits that is different compared with the known solution described above.

It should be stated that the manufacturing according to the known solution makes provision for writing a logic value relating to the input of the "Chip Select" selection of each memory circuit, impacting the memory part of the memory circuit as such, in order to be identified within a stack of memory circuits.

According to the invention, provision is made for writing, during the making of the stack, a logic value relating to the memory circuit within a distinct configuration device separate from the memory part of the memory circuit as such.

It should be noted that the memory circuit stack made according to the invention comprise one or more memory circuits that are not valid in operation.

The invention therefore imposes no constraint with regard to the nature of the result of the validity test on each memory circuit for use thereof within the stack.

Compared with the known solution identified above, a memory circuit stack can be made not only by means of one or more memory circuits valid in operation but also with one or more memory circuits not valid in operation. Unlike the solution of the prior art, no material used for producing a stack is rejected and the material, including that tested as being not valid in operation, is used to produce a stack. Because of this, no step of selecting memory circuits valid in operation is implemented to form a stack.

In this way, the making of a stack of memory circuits according to the invention is more rapid and less expensive to produce since any memory circuit tested as being non-valid is not rejected.

Thus the manufacturing method of the invention proposes a novel approach for identifying and therefore selecting a memory circuit within a stack while improving the efficiency of production of a stack.

According to another aspect, the invention is a method for addressing a memory circuit within a stack of memory circuits.

According to the invention, the method comprises a step of comparing, at a device for configuring the memory circuit within the stack, an item of address information with an item of information relating to an identifier attributed to the memory circuit within the stack and, should the address information correspond to the information relating to the identifier of the memory circuit, a step of reading an item of information relating to a result of a memory circuit validity test.

A memory circuit is marked by a marker or identifier that is particular to it. The marker is used to identify the memory circuit within a stack of which it forms part.

When an address identifies a particular memory circuit within the stack because of an item of address information corresponding at least partly to the identifier attributed to the memory circuit, the information relating to the validity of the memory circuit is read.

The information concerning the validity of the memory circuit informs whether the memory part of the memory circuit identified by its identifier is valid or not, that is to say whether it is free from faults or whether it is on the contrary defective.

Finally, the invention is a stack of memory circuits.

More exactly, the stack comprises at least two memory circuits stacked one on the other.

According to the invention, each memory circuit comprises a device for configuring each memory circuit within the stack, the configuration devices comprising means for storing information relating to an identifier attributed to the memory circuit within the stack, and information relating to a result of a validity test on the memory circuit.

It is clear that the memory circuit configuration device may be internal or external to the memory circuit. The memory circuit configuration device may constitute a configurable part of the memory circuit that is associated therewith during its own manufacture.

In this way, a memory circuit may comprise, apart from a memory part proper, a "configuration" part within the memory circuit or be associated with a device external to the circuit, as a configuration device. The "configuration" device is used firstly to identify or mark the memory circuit among the various memory circuits making up the stack, and secondly to inform on the state of operation of the memory part of the memory circuit.

It will therefore be understood that the "configuration" device for a memory circuit is used, in configuration mode, for writing, and then, in operating mode, for reading before being able to address, in read and/or write mode, the "memory" part of the memory circuit.

The validity of the memory circuit is or is not confirmed depending on whether the information relating to the validity of the memory circuit corresponds to the correct or faulty functioning of the memory part of the memory circuit.

DESCRIPTION OF THE DRAWINGS

Other features and advantages of the invention will emerge from a reading of the description of a preferential embodiment of the invention, given by way of simple non-limitative indicative example, and the accompanying drawings, in which.

DESCRIPTION OF A PARTICULAR
EMBODIMENT OF THE INVENTION

Figure 1:
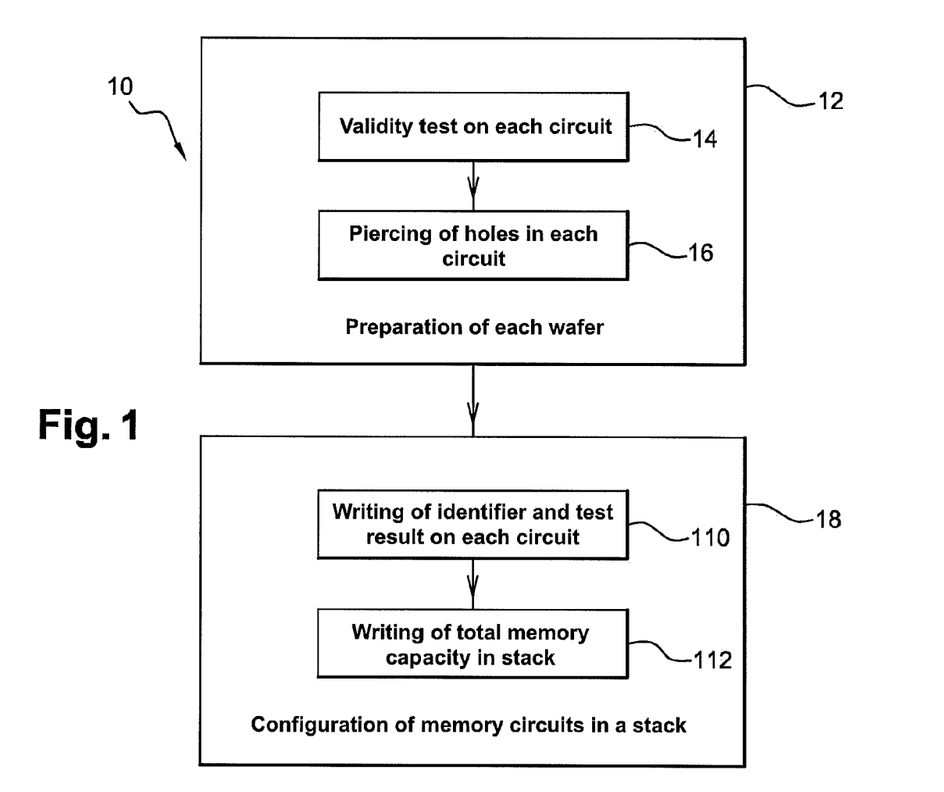
FIG. 1 presents a simplified flow diagram of an embodiment of a method of making a stack of memory circuits, according to the invention.

As shown in FIG. 1, an embodiment of a method 10 of making a stack of memory circuits is explained as an example.

Each stack or stacking of memory circuits is composed of memory circuits coming from distinct respective wafers stacked on one another.

A wafer is a sheet of material based on silicon composed of several simultaneously etched memory circuits. Typically, a wafer comprises, according to its dimensions and those of each memory circuit, up to a few tens of thousands of memory circuits.

It is in particular possible to cite, as memory circuits to which the manufacturing method 10 explained below can be applied, non-volatile memories of the following types:

EEPROM (the acronym for "Electrically Erasable Programmable Read-Only Memory");
ROM (the acronym for "Read Only Memory");
Flash;
FERAM (the acronym for "Ferroelectric Random Access Memory");
MRAM (the acronym for "Magnetoresistive Random Access Memory").

Naturally such a list is not exhaustive.

The method 10, according to the embodiment presented, comprises a phase 12 of preparing each wafer intended to be used, in order to form, for example, as many stacks as there are memory circuits making up a wafer.

The memory circuit wafers used for making stacks of memory circuits are identical, and directly superimposable. Thus it is in particular necessary to have to make a movement of a wafer with respect to another wafer in order to make corresponding inputs and/or outputs of various memory circuits to be coupled coincide.

Each memory circuit of a given wafer is marked according to its coordinates, for example Cartesian, within the wafer concerned.

First of all, during the phase 12 of preparing a wafer provided, a tester tests 14 all the memory circuits of the wafer in question with regard to the validity in operation of the memory part of each memory circuit.

Such a test is for example implemented, in whole or in part, by means of a self-test device called a "scan" or "BIST" (standing for "Built-in Self Test") known per se, consisting mainly of verifying, autonomously, the internal functionality of the integrated memory circuit.

According to a variant embodiment, such a test is implemented externally to the integrated memory circuit tested, that is to say from an external device capable of generating a signal transporting a predetermined value as the input of at least some memory addresses and then reading, as an output, for each address tested, the value actually stored.

The test consists for example of sending, for each memory address, during writing, the input of the memory circuit concerned, a predetermined test value in accordance with a predetermined pattern and comparing the value read, for each address concerned, with the value written. If the information read corresponds to the information written for each address in the memory area of the memory circuit, then the memory circuit tested is valid in operation. Otherwise, that is to say if at least one item of information read does not correspond to the information written for an address of the memory part of the memory circuit, then the memory circuit tested is not valid in operation.

The manufacturing method proposed is for example compatible with a known technology called "3D SIP" (the acronym for "3D System-In-Package") corresponding to a technology for producing stacking silicon material by three-dimensional wafer. The "3D SIP" method consists in particular of superimposing and fixing together the stack of wafers by aligning and sealing the wafers.

A wafer represents a single stage of as many stacks as there are memory circuits making up the wafer.

When the memory circuit tested is valid, that is to say operating correctly, a predetermined value coded in one bit, for example the value "one", is attributed to it.

When the memory circuit tested is not valid, that is to say operating wrongly, another predetermined value coded in one bit, for example the value "zero", is attributed to it.

Such a test per wafer is repeated on as many wafers as there are memory circuits that must make up a stack.

At the end of the test on all the memory circuits in the wafer, the tester stores an electrical image particular to the wafer concerned of all the corresponding validity results. To do this, the tester used has in a memory internal to the tester or in an external memory accessible from the tester, for each wafer identified, Cartesian coordinates of the memory circuits operating correctly and wrongly.

The electrical image stored identifies the valid or non-valid characteristic of each memory circuit associated with the Cartesian coordinates of any memory circuit within the wafer in question and identified within a memory of the tester or a memory connected to the tester.

Following the tests on the various wafers, the tester stores in the internal memory or in a memory to which the tester can gain access, a three-dimensional (or 3D) electrical image of the state of each memory circuit of all, the wafers tested and identified by a number of the manufacturing rank within the stack to be tested.

The 3D electrical image represented, for example, in the form of an electronic mapping data log (or "E-mapping datalog"), is compatible with known test equipment. Thus it is not necessary to adapt the resulting 3D electrical image in order to be able to use it subsequently, to configure the memory circuits of each stack.

Then, for each wafer tested, during the preparation phase 12, during a following step 16 of piercing its memory circuits, a hole is formed at each connection pin of the memory part, for a part relating to data, for a part relating to addresses, for an input relating to a selection of the memory circuit (or "Chip Select"), and for at least two terminals for supplying the memory circuit.

During the piercing step 16, a hole is also formed, at a configuration device provided on each memory circuit, at one or more inputs relating to information particular to an identifier to be attributed to the memory circuit within the stack to be formed.

Optionally, still during the piercing step 16, a hole is also formed, at the self-test device, according to the physical rank of the wafer provided within the stack being produced. In other words, the holes at each self-test device are coded according to the position of the memory circuit within the stack to be produced.

The device for configuring each memory circuit makes it possible to select the memory circuit with which the configuration device is associated.

The hole or holes thus formed give physical access to the configuration device relating to each memory circuit of the wafers involved in the formation of stacks.

The configuration device is for example internal to the memory circuit. The configuration device advantageously corresponds to configurable hardware provided during the manufacture of each memory circuit within a wafer.

Likewise, still during the piercing step 16, a hole is also formed, at the configuration device provided on each memory circuit, at one or more inputs for information particular to the result of the validity test on the memory circuit in question.

According to a variant embodiment not shown, the step of piercing the memory circuits included within the wafer precedes the step of testing the memory circuits in the wafer.

Once the memory circuits in each wafer have been prepared, namely tested and then pierced, at least some of the following phases (not shown) relating to the formation of the stacks are passed to:
- a phase of superimposing memory circuits of different prepared wafers causing through holes formed within the memory part to coincide, and some through holes formed within the configuration part of memory circuits to be stacked on one another;
- a phase of fixing together the prepared wafers consisting, for example, of applying adhesive between the wafers to be fixed;
- a phase of filling, by means of an electrically conductive material, such as a metal based on silicon, the through holes and non-through holes relating to the memory parts and configuration of the memory circuits accessible from the highest wafer;
- a phase of testing electrical continuity through a wired self-test according to a physical address decoding of the wafer within the stack.

Once the preparation of the wafers involved in the formation of stacks has ended, supplemented by at least one of the aforementioned phases, a phase 18 of configuring each memory circuit in a stack is passed to, for each stack.

According to the invention, the configuration phase 18 comprises a step 110 of writing, within the configuration device for each memory circuit included within the stack, firstly information relating to an identifier attributed to the memory circuit within the stack and secondly information relating to a result of the memory circuit validity test.

The inputs of the memory part of the memory circuit are not affected by any writing during the configuration phase. Only the configuration device for the memory circuit, as a distinct part of the memory part of the memory circuit, is impacted during the configuration phase.

The writing per se of the information concerned can be implemented by programming, for example in the form of a state word.

Information relating to the identifiers attributed to the various memory circuits of each stack is supplied by virtue of the 3D electrical image stored within the internal memory of the tester or in the external memory accessible from the tester.

Likewise the information relating to the results of the validity test on each memory circuit are supplied by virtue of the 3D electrical image stored within the internal memory of the tester or in the external memory accessible from the tester.

In this way, each memory circuit used within a stack is identifiable, in that it has been tested as being valid or not valid in operation. When a memory circuit is selected by its identifier among all the memory circuits in the stack, the memory circuit selected is characterised by its operating validity state.

According to such manufacture of a stack of memory circuits, either an internal part of each distinct memory circuit of the memory part proper or an external part of each memory circuit, while being associated with the memory circuit, is modified. Thus the memory part of each memory circuit is kept and is therefore not modified either according to a hardware aspect or according to a software aspect.

Once the writing of the information particular to the identifiers of the memory circuits and to the results of the tests of their respective validities has been done for each stack, a subsequent step 112 of writing information relating to the total memory capacity relating to all the valid circuits within the stack concerned is proceeded with.

During such a step 112, information relating to a total memory capacity particular to all the memory circuits included within the stack and where the individual result of the validity test corresponds to a valid in operation state is written within a predetermined memory address of the first memory circuit included within the stack and where the result of the validity test corresponds to a valid in operation state. The memory address of the stack is for example the first address accessible from the stack of memory circuits thus configured, as an electronic signature particular to the stack.

Once the configuration phase has been performed, it is possible to pass to the wafer cutting phase (not shown) so as to separate the stacks of memory circuits thus configured.

It will be recalled that a single memory circuit tested non-valid in operation within a stack makes the stack defective if access thereto is not prevented.

The memory circuits in a stack tested non-valid in operation are inhibited for access during configuration thereof and thereby "invalidated" for any subsequent attempt at access.

The efficiency of production of the stacks is advantageously improved.

Figure 2:
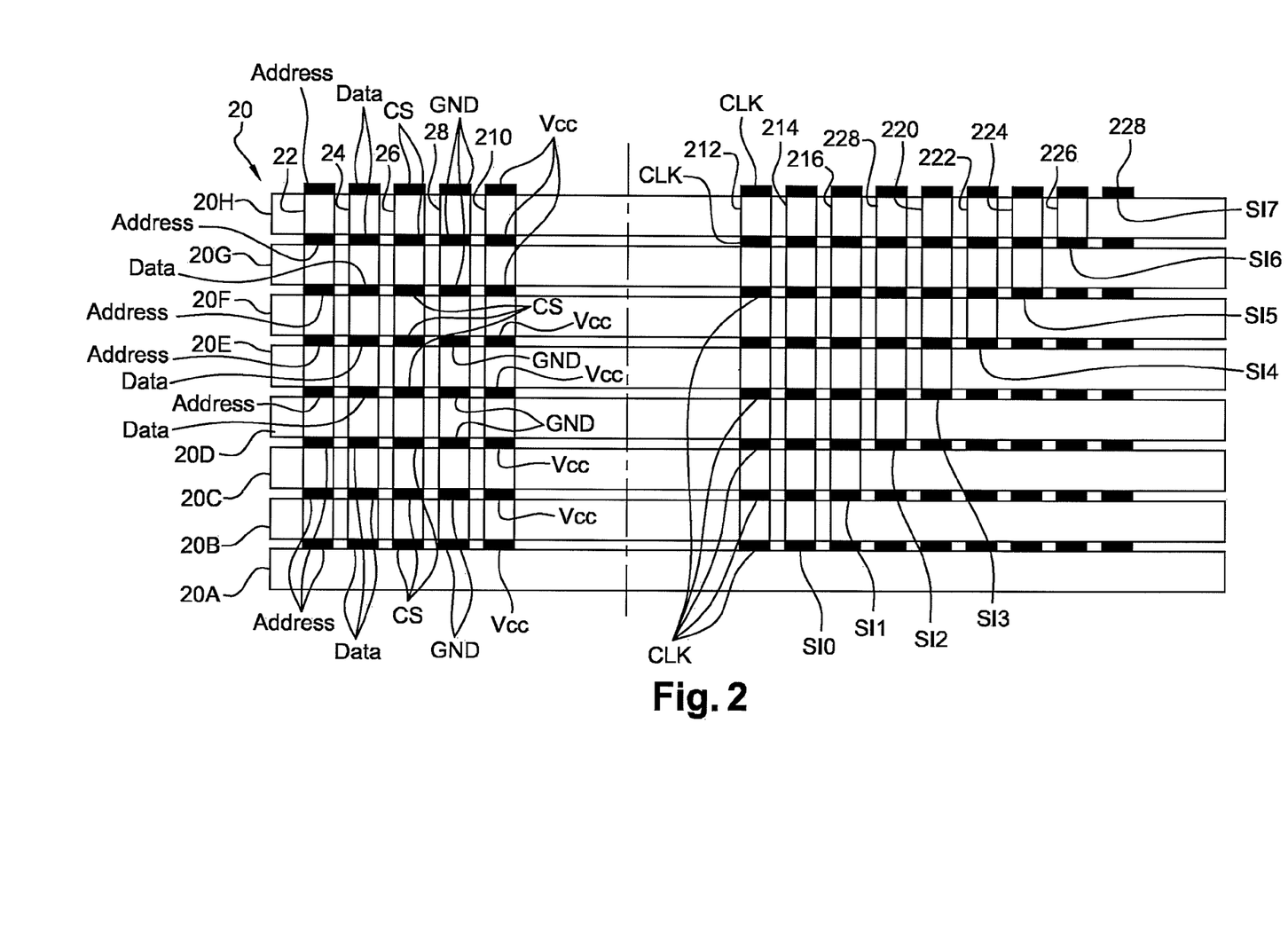
FIG. 2 illustrates a schematic view in section of an embodiment of the stack made by means of the manufacturing method according to FIG. 1.

A stack 20 of eight memory circuits 20A, 20B, 20C, 20D, 20E, 20F, 20G, 20H according to an example resulting from the manufacturing method detailed above is now explained in relation to FIG. 2.

FIG. 2 shows schematically the resulting stack 20.

It is clear that the invention can be made compliant with all existing or future standards.

Among the current standards, a so-called JEDEC standard (the acronym for "Joint Electron Device Engineering Council") for addressing "Nand" memories from the outside can in particular be cited.

According to the JEDEC standard, known per se, there are provided a bus with eight inputs/outputs (or Input/Output data/address bus), multiplexing the corresponding data and addresses, a selection input of the memory circuit (or "Chip Select" with the acronym "CS" or "Chip Enable" with the acronym "CE"), six input pins relating to a control logic, namely a read enable pin (with the acronym RE), a write enable pin (with the acronym WE), a write protect pin (with the acronym WP), a ready/busy information pin (with the acronym RB), an address latch enable pin (with the acronym ALE), a command latch enable pin (with the acronym CLE), and four pins relating to supply, including two for earth (or "GND") and two for the supply voltage ("Vcc").

By way of indication, the supply voltage may be 5 volts, 3 volts or 1.8 volts. Naturally the supply voltage is not restricted solely to these values.

The stack 20 of memory circuits 20A, 20B, 20C, 20D, 20E, 20F, 20G or 20H advantageously results from the cutting of several respective memory circuit wafers.

Each memory circuit 20A, 20B, 20C, 20D, 20E, 20F, 20G or 20H results from a cutting of a wafer and constitutes a stage of the stack 20.

The part situated on the left of the broken line shown in FIG. 2 corresponds, for each memory circuit 20A, 20B, 20C, 20D, 20E, 20F, 20G or 20H, to the functional part of the memory circuit concerned, namely the memory part proper.

The memory part of each memory circuit comprises, except for the memory circuit 20A situated at the bottom of the stack, through holes 22, 24, 26, 28 and 210 facing each connection pin constituting an input, namely:

an "address" input particular to an address bus,
a "data" input particular to a data bus,
a "CS" (standing for "Chip Select") input particular to a selection of the memory circuit concerned,
a "GND" input particular to a first supply terminal of the memory circuit concerned, for example 0 volts, and
a "Vcc" input particular to a second supply terminal of the memory circuit concerned.

The inputs "address", "data", "CS", "GND" and "Vcc" of the memory part of the upper memory circuit 20A are electrically connected to the corresponding inputs of each memory circuit 20A, 20B, 20C, 20D, 20E, 20F and 20G that is situated under the upper memory circuit 20A.

The inputs of the memory circuits 20A, 20B, 20C, 20D, 20E, 20F, 20G and 20H are joined in order to form a single memory entity with a single common input "CS" for the stack thus formed. The logic value allocated to the common input "CS" is unique.

The logic value of a memory circuit to be selected within the stack by means of its "CS" input is therefore not modified, unlike the known solution.

The part situated to the right of the broken line corresponds, for each memory circuit 20A, 20B, 20C, 20D, 20E, 20F, 20G or 20H, to a part relating to a configuration device for the memory circuit concerned.

Each memory circuit in the stack 20 is referenced by a value corresponding advantageously to its rank within the stack. Thus the upper memory circuit 20H in the stack 20 corresponds for example to the memory circuit referenced by the value "7" corresponding in binary to the value "111", on the eight memory circuits. The lower memory circuit 20A of the stack 20 corresponds for example to the memory circuit referenced by the value "0" corresponding in binary to the value "000".

Seven memory circuits 20B, 20C, 20D, 20E, 20F, 20G and 20H comprise, at their respective configuration device, at least one hole (following the step 16 of piercing the memory circuit), at at least one input that is shared and/or dedicated firstly to the identifier attributed to the memory circuit concerned within the stack and secondly to the information relating to the result of the validity test of the memory circuit.

The holes pierced at the configuration devices are connected with the rank occupied by each memory circuit within the stack 20.

The various inputs are presented in more detail in relation to FIG. 3 described below.

A first input particular to a clock signal "CLK" is common, in the present example, to all the configuration devices of all the memory circuits 20A, 20B, 20C, 20D, 20E, 20F, 20G and 20H.

Thus the upper memory circuit 20H comprises, at its configuration device (detailed in relation to FIG. 3), holes 212, 214, 216, 218, 220, 222, 224 and 226, and an electrically conductive input terminal 228. The holes 212, 214, 216, 218, 220, 222, 224 and 226 afford physical access to at least one entry that is shared and/or dedicated to the information relating to the identifier attributed to a memory circuit situated below the memory circuit 20H within the stack and at least one entry that is shared and/or dedicated to the information relating to the result of the validity test on the memory circuit below the memory circuit 20H.

For example, the memory circuit 20A of a first stage within the stack 20 comprises no hole while having two inputs accessible from the top of the stack, one particular to the clock signal "CLK" and the other relating to its serial input "SI0" (standing for "Serial Input number 0"). These two inputs CLK and SI0 are necessary for configuring the configuration device for the lower memory circuit 20A. More precisely, the input CLK is used to supply the clock signal to the configuration device. The input SI0 is used to be able to parameterise firstly the identifier attributed to the memory circuit 20A of the first stage and secondly the result of the validity test on the memory circuit 20A of the first stage.

The memory circuit 20B of a second stage within the stack 20 comprises two holes for connecting, from the top of the stack 20, the two inputs relating to the clock signal CLK and to the serial input 0 SI0 of the memory circuit 20A of the first stage, and three inputs relating to the clock signal CLK, the serial input 0 SI0 and a serial input 1 "SI1" in order to configure the configuration device for the memory circuit 20B of the second stage.

The memory circuit 20C of a third stage within the stack 20 comprises three holes for connecting, from the top of the stack 20, the three inputs CLK, SI0 and SI1 of the memory circuit 20B of the second stage, and four inputs relating to the clock signal CLK, to the serial inputs SI0 and SI1, and to a serial input 2 "SI2" for configuring the configuration device for the memory circuit 20C of the third stage.

And likewise, as far as the memory circuit 20H of the eighth and last stage within the stack 20, the upper memory circuit 20H comprises eight holes for physically accessing, from the top of the stack 20, eight inputs CLK, SI0 to SI6, to a memory circuit 20A, 20B, 20C, 20D, 20E, 20F, 20G of a stage lower than the memory circuit 20H of the last stage, and nine inputs relating to the clock signal CLK, to the serial inputs SI0 to SI6 and to a serial input 7 "SI7" for configuring the configuration device for the memory circuit 20H of the last stage.

The holes 212, 214, 216, 218, 220, 222, 224 and 226 are provided with an electrically conducting material in order to make the inputs of the memory part of each memory circuit and the inputs of the configuration device for each memory circuit electrically accessible.

The inputs are short-circuited at height "Z" along one of the three-dimensional coordinates. No technique of re-routing in metal is therefore necessary for the connection.

Each memory circuit of the stack 20 comprises, at the configuration device, two inputs, one of which is dedicated to it for the configuration thereof, accessible from the top of the stack 20, through a corresponding electrically conductive input terminal.

A first input, namely the input relating to the clock signal CLK, is common to all the eight memory circuits 20A, 20B, 20C, 20D, 20E, 20F, 20G, 20H and accessible from the outside of the stack 20, at their respective configuration device.

A second input, namely the serial input SI, is specific to each memory circuit at its configuration device and accessible from the outside of the stack 20.

Thus the lower memory circuit 20 or that of the first stage comprises the serial input 0 "SI0", the memory circuit 20B of the second stage the serial input 1 "SI1", the memory circuit 20C of the third stage the serial input 2 "SI2", the memory circuit 20D of the fourth stage the serial input 3 "SI3", the memory circuit 20E of the fifth stage the serial input 4 "SI4", the memory circuit 20F of the sixth stage the serial input 5 "SI5", the memory circuit 20G of the seventh stage the serial input 6 "SI6", and the memory circuit 20H of the eighth and last stage the serial input 7 "SI7".

The specific serial input 7 "SI7" that has to be accessible solely from the memory circuit 20H of the last stage is served by the input terminal 228. This is the reason why the memory circuit 20H of the last stage does not have, for this serial input 7 "SI7", a hole passing through this memory circuit 20H.

The eight memory circuits 20A, 20B, 20C, 20D, 20E, 20F, 20G, 20H have identical individual memory capacities, for example of 1 gigabyte. The stack 20 thus formed may have a total capacity that may range from 0 gigabytes to 8 gigabytes according to the number of memory circuits valid in operation and included within the stack.

After having determined the resulting total memory capacity, corresponding information is written and stored within a particular predefined memory area, or page, of the memory part, for example the page "zero", of the first valid memory circuit starting from the bottom part of a resulting memory block of the stack thus formed.

The memory block may be put in a can using for example a conventional so-called bonding technique, leaving physical access to the inputs of at least the memory part of the upper memory circuit 20H. The can enclosing a stack is ready to be coupled for example to a microprocessor or to a logic processing unit or the like, in order to be used as a memory block.

According to the embodiment presented, the part situated to the right of the dotted lines relating to the configuration devices for the memory circuits is not left accessible from the outside of the memory block. Thus no information relating to an identifier attributed to a memory circuit included within the stack nor any information relating to a result of the validity test on a memory circuit included within the stack can be modified after it is configured during manufacture thereof. In other words, the identifier attributed to each memory circuit and the value of the validity test result associated therewith are fixed.

It is clear however that, according to another embodiment, the part situated to the right of the broken lines relating to the configuration devices for the memory circuit is less accessible from the outside of the memory block. Thus information relating to an identifier attributed to a memory circuit included within the stack and/or information relating to a result of the validity test on a memory circuit included within the stack can be modified after configuration thereof, that is to say dynamically.

Figure 3:
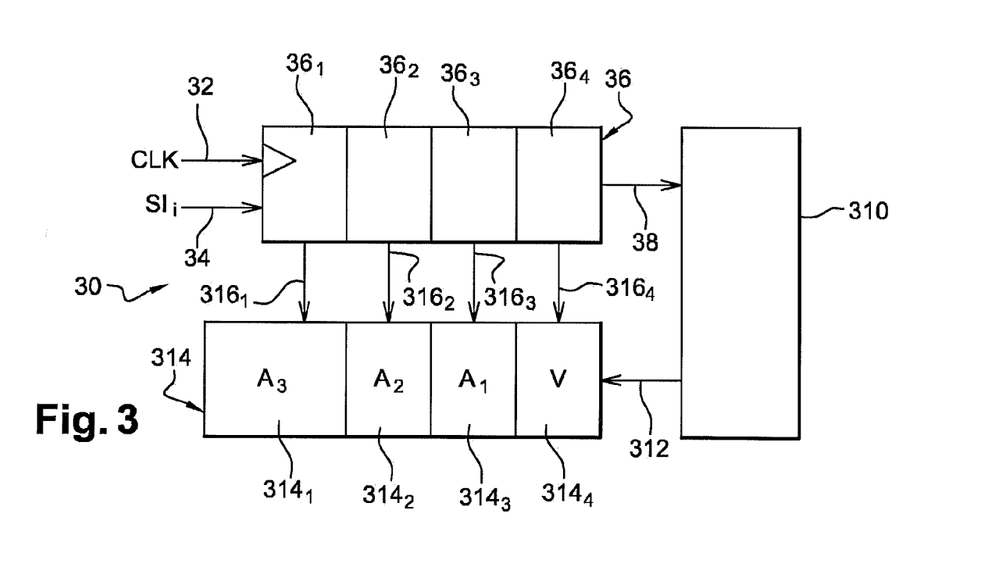
FIG. 3 presents a detailed diagram of an embodiment of a configuration device particular to each memory circuit provided within the stack of FIG. 2.

As presented in relation to FIG. 3, each memory circuit 20A, 20B, 20C, 20D, 20E, 20F, 20G, 20H comprises for example a part distinct from its memory part internal to the memory circuit. Such a distinct part constitutes a device 30 for configuring the memory circuit within the stack 20.

The device 30 for configuring the memory circuit comprises two inputs, namely a first input 32 corresponding to a clock signal "CLK" and a second input 34 corresponding to a serial input "SIi" dedicated to the memory circuit, the "i" corresponding to the rank of the memory circuit concerned within the stack 20.

The device 30 for configuring the memory circuit within the stack comprises:
 a serial shift register 36,
 a device 310 for writing a state word, and
 a memory space 314 for the state word.

The serial shift register 36 comprises four register stages $36_1$, $36_2$, $36_3$ and $36_4$. The number of register stages is equal to the number of bits necessary for coding the information relating to the identifier attributed to the memory circuit within the stack and the information relating to the result of the memory circuit validity test.

As known per se, the first input 32 dedicated to the clock signal is common to all the four stages $36_1$, $36_2$, $36_3$ and $36_4$ for timing the storage within the serial shift register 36.

Apart from the input dedicated to the clock signal, each of the first three stages $36_1$, $36_2$, $36_3$ comprises an input (shown for the first stage only), an output connected to the stage $32_2$, $36_3$ and $36_4$ that succeeds it (not shown), and another output $316_1$, $316_2$, $316_3$ and $316_4$ that supplies the value of the bit at the input of the stage concerned.

At each new pulse of the clock signal "CLK", the value situated at the input of a stage is copied at the output of the stage in question, the value of a bit in a bit stream situated at the input SIi is propagated from stage to stage within the serial shift register 36.

At the time of the first pulse of the clock signal "CLK" (on a rising edge or a falling edge), the first stage $36_1$ records the value of the first bit of a bit stream situated at the input 34 SIi and presents it at the output available to the second stage $36_2$ and at its other output $316_1$.

At the second pulse of the clock signal "CLK", the second stage $36_2$ records the value of the first bit of the bit stream issuing from the first stage $36_1$ and presents it as an output available to the third stage $36_3$ and at its other output $316_2$. At the same time, the first stage $36_1$ records the value of the second bit of the bit stream coming from the input 34 SIi and presents it as an output available to the second stage $36_2$ and at its other output $316_1$.

At the third pulse of the clock signal "CLK", the third stage $36_3$ records the value of the first bit of the bit stream issuing from the second stage $36_2$ and presents it as an output available to the fourth stage $36_4$ and at its other output $316_3$. At the same time, the second stage $36_2$ records the value of the second bit of the bit stream issuing from the first stage $36_1$ and presents it as an output available to the third stage $36_3$ and at its other output $316_2$. In parallel, the first stage $36_1$ records the value of the third bit of the bit stream coming from the input 34 SIi and presents it as an output available to the second stage $36_2$ and at its other output $316_1$.

At the end of the fourth pulse of the clock signal "CLK", the fourth stage $36_4$ records the value of the first bit of the bit stream issuing from the third stage $36_3$ and presents it as an output available to the fourth stage $36_4$ and at its other output $316_4$. At the same time, the third stage $36_3$ records the value of the second bit of the bit stream issuing from the second stage $36_2$ and presents it as an output available to the fourth stage $36_4$ and at its other output $316_3$. Simultaneously, the second stage $36_2$ records the value of the third bit of the bit stream issuing from the first stage $36_1$ and presents it as an output available to the third stage $36_3$ and at its other output $316_2$. In parallel, the first stage $36_1$ records the value of the fourth bit of the bit stream coming from the input 34 SIi and presents it as an output available to the second stage $36_2$ and at its other output $316_1$.

Each stage of the serial shift register is intended to temporarily record a binary value of part of the coding of the information relating to the identifier attributed to the memory circuit within the stack or of the coding of the information relating to the result of the memory circuit validity test.

In a manner known per se, at least one memory address bit is provided for addressing the memory part of each memory circuit.

The information relating to the identifier attributed to the memory circuit within the stack reflects the logic and/or physical rank of the memory circuit in binary form. Such information is coded in at least one address bit added to those particular to the address of the memory part.

The stack 20 comprising eight memory circuit stages, the information relating to the identifier attributed to the memory circuit is coded for example in three additional address bits.

For example, at the end of four clock pulses, the first stage $36_1$ is intended to record the value of the third address bit A3, the second stage $36_2$ the value of the second address bit A2, and the third stage $36_3$ the value of the first address bit A1.

The information relating to the result of the validity test on the memory circuit concerned is coded in at least one bit.

A single bit may suffice for example to code the result of the memory circuit validity test saved temporarily in the last stage $36_4$ of the register 36.

For example, after four clock pulses, the fourth stage $36_4$ is intended to record the value of the bit relating to the result of the validity test of the memory circuit concerned. For example, the value "1" means that the memory circuit in question is valid while the value "0" means that it is defective.

The last stage $36_4$ of the register 36 is connected, through an input 38, to the device 310 writing a state word, in order to transmit the clock signal CLK.

The device 310 writing a state word is used for detecting the fourth pulse of the clock signal CLK. The device 310 writing a state word generates, at an output 312 connected to the memory space 314 of the state word, a signal reflecting the detection of the fourth pulse of the clock signal CLK.

The memory space 314 of the state word is preferably a predefined particular memory area (or page) of the memory part of the memory circuit concerned. Such a memory area is separate from the memory part of the memory circuit intended to be used in operation, in order to store data issuing from outside the memory circuit (included within the stack).

The memory space 314 of the state word comprises a number of memory cells $314_1$, $314_2$, $314_3$ and $314_4$ equal to the number of stages included within the serial shift register. The memory cells $314_1$, $314_2$, $314_3$ and $314_4$ are connected, at a so-called validation input, to the output 312 of the device 310 for writing a state word. Each memory cell $314_1$, $314_2$, $314_3$ and $314_4$ is also connected, via a respective input, to the output $316_1$, $316_2$, $316_3$ or $316_4$ of a corresponding stage $36_1$, $36_2$, $36_3$ and $36_4$ of the serial shift register 36. Each memory cell $314_1$, $314_2$, $314_3$ and $314_4$ is adapted to copy, at the time of the generation of the validation signal issuing at the output 312 of the device 310 for writing a state word when the fourth pulse of the clock signal CLK is detected, the binary value available on an input connected to the output of the corresponding stage $316_1$, $316_2$, $316_3$ or $316_4$ of the serial shift register 36.

Each memory cell $314_1$, $314_2$, $314_3$ and $314_4$ is designed to store a binary value constituting either part of the information relating to the identifier attributed to the memory circuit within the stack or part of the information relating to the result of the validity test on the memory circuit concerned.

When the fourth pulse of the clock signal CLK is detected, the first cell $314_1$ stores the value of the third bit of the supplementary address A3, the second cell $314_2$ the value of the second bit of the supplementary address A2, the third cell $314_3$ the value of the first bit of the supplementary address A1 of the memory circuit concerned, and the fourth cell $314_4$ the value of the validity or non-validity bit of the memory of the memory circuit concerned.

The four memory cells $314_1$, $314_2$, $314_3$ and $314_4$ store the state word and constitute for example four buffers each saving its value. Preferably, these four memory cells $314_1$, $314_2$, $314_3$ and $314_4$ are fixed once the configuration phase has ended. The four memory cells $314_1$, $314_2$, $314_3$ and $314_4$ constitute for example four non-volatile Flash cells.

The state word therefore consists of four bits constituting an item of information for addressing the memory circuit, additionally with respect to the conventional memory circuit addressing bits.

The value of a bit V on the validity or non-validity of the memory of the memory circuit in question is used to select or on the contrary not select the memory circuit concerned.

Such a device for configuring each memory circuit within the stack constitutes simple additional logic circuitry.

According to an alternative embodiment, the device for configuring each memory circuit within the stack is based on a circuit based on fuses. The number of fuses is for example equal to the number of bits necessary for coding the information relating to the identifier attributed to the memory circuit within the stack and the information relating to the result of the memory circuit validity test. An electrically closed fused corresponds for example to the binary value "0" while an electrically open fuse corresponds to the binary value "1". Naturally, according to another embodiment, a reverse convention may be adopted, namely the closed fuse corresponds to the binary value "1" and the open fuse corresponds to the binary value "0".

In addition, each memory circuit has, in addition to an address comparator (not shown) particular to its memory part, an address comparator (not shown) particular to its configuration part and relating to the additional address bit or bits relating to the information relating to the identifier attributed to the memory circuit concerned within the stack.

Advantageously, the information relating to the identifier attributed to the valid memory circuits in the same stack during the configuration of them is provided with continuous values. That is to say two memory circuits valid in operation physically closest within the stack have identifiers with consecutive values. In other words, two valid memory circuits possibly separated by one or more non-valid memory circuits are addressed continuously, namely without an addressing hole or discontinuity. As soon as there exists at least one memory circuit valid in operation, the stack of memory circuits forms a continuous addressing plane of the memory circuit or circuits tested valid in operation, whatever the number of memory circuits not valid in operation in the stack in question.

The state word is written within each configuration device for a memory circuit of the stack during a configuration phase, for example during a final test on validity of the stack. The final test is performed for example by means of a logic scan on the memory space thus formed within the stack.

The information stored within the tester or accessible from the tester, according to which the memory circuit is good or faulty in operation and the rank of the memory circuit occupied within the stack is written.

For example the memory circuit 20A of the first stage (starting from the bottom) of the stack is configured, using the serial input 0 "SI0" of a serial bus consisting of serial inputs SI0 to SI7, after four pulses of the clock, by means of a nibble "A3A2A1V", where the validity bit V represents the least significant bit of the nibble. If the memory of the memory circuit of the first stage is valid, then the nibble "0001" in this order is written, at a first writing, in four memory cells of the configuration device for the memory circuit 20A of the first stage. If the memory of the memory circuit of the first stage is not valid, then the nibble "0000" in this same order is written at a first writing in four memory cells of the configuration device for the memory circuit 20A of the first stage.

It should be noted that, when the configuration device for the memory circuit of the first stage is configured, the seven other configuration devices particular to the seven other memory circuits of the stack are, at the same time, also impacted in writing. However, the seven nibble values written in the corresponding configuration devices will be overwritten and replaced subsequently during respective configurations thereof.

Next, the memory circuit 20B of the second stage of the stack is in its turn configured, using the serial input 1 "SI1" of the serial bus, after four clock pulses, by means of a nibble "A3A2A1V", where the validity bit V is the least significant bit of the nibble. If the memory of the memory circuit 20B of the second stage is valid and the memory of the memory circuit 20A of the first stage is valid, then the nibble "0011" in this order is written, during a second writing, in four memory cells of the configuration device for the memory circuit 20B of the second stage.

If the memory circuit of the first stage is not valid and the memory of the memory circuit 20A of the first stage is valid, then the nibble "0010" in this same order is written at the time of a second writing. At the time of the second writing of the nibble within the configuration device for the memory circuit 20B of the second stage, the nibble previously configured during the first writing is updated with the nibble written by means of the second writing. The nibble written during the first writing within the configuration device for the memory circuit 20A of the first stage remains unchanged, and therefore equal to the nibble "0001".

If on the other hand the memory of the memory circuit 20A of the first stage is not valid and the memory of the memory circuit 20B of the second stage is valid, then the nibble "0000" is confirmed within the four memory cells of the configuration device for the memory circuit 20B of the second stage. This is because the memory circuit 20B of the second stage constitutes the first valid address of a valid memory circuit starting from the bottom of the stack.

And this continues for the configuration of the memory circuit situated above the memory circuits of the first and second stages of the stack.

According to a preferential embodiment of each configuration device for a memory circuit provided within the stack, the configuration device is inoperative in functional mode, that is to say it is not electrically accessible in order to change the value of the state word written in its own memory cells. To do this, any external entity, such as a microprocessor or a logic processor unit, electrically connected to the memory part of each memory circuit of the stack, is not wired to the configuration part of the memory circuit concerned. Naturally, the value of the written word remains accessible in read mode from the outside of the stack.

According to another embodiment, each configuration device for a memory circuit provided within the stack is also operative in functional mode, that is to say it is electrically accessible in order to change, dynamically, the value of the state word written in its own memory cells. To do this, any external entity, such as a microprocessor or a logic processing unit, electrically connected to the memory part of each memory circuit of the stack, is also connected to the configuration part of the memory circuit concerned. Another embodiment of this type proves advantageous for a stack where at least one memory circuit that makes it up becomes invalid, for example following an excessively great stressing in write and/or read mode.

According to such an embodiment, as soon as a memory of a memory circuit becomes invalid, the electronic signature of the stack is also updated with a value corresponding to the sum of the memory spaces of the memory circuits of the stack remaining valid. In such a mode, an addressing hole appears for the external entity connected to the stack that must take account of it in a software fashion, by making in particular an address translation, and managing each memory circuit detected as invalid in functional mode by no longer addressing them.

There is thus attributed to the first valid memory circuit within the stack 20, starting from the bottom of the given stack, the addressing binary value "000", and the value "1" for validation thereof.

Because of such an addressing mode formed by the three additional address bits supplemented by a validation bit, it is possible to isolate any defective memory circuit making up the stack, and therefore not to address it.

It should be noted that, if all the memory circuits of the stack are valid, then the logic rank of the memory circuit corresponds to its physical rank within the stack when the additional address bits are observed.

It will be understood that, once the memory circuits of the stack have been configured, only the memory circuit or circuits referenced as being valid for the memory part thereof are addressed in order to access their respective memory parts.

To address a memory circuit within the stack, address information is first of all, in operation, compared with information relating to the identifier attributed to the memory circuit within the stack formed by the value of the three additional address bits A3A2A1.

Then, if the address information corresponds to the information relating to the identifier attributed to the memory circuit within the stack, information relating to the result of the validity test on the memory circuit formed by the value of the additional bit V is read.

If the value of the additional bit V read corresponds to the one attributed to a valid memory part for the memory circuit selected, then access to any address in the memory space of the memory circuit selected and identified by the value of the three additional address bits A3A2A1 that were allocated to it is enabled.

In the contrary case, that is to say if the value of the additional bit V read corresponds to the one attributed to a memory part that is not valid for the memory circuit selected, then access to any address in the memory space of the memory circuit selected and identified by the value of the three additional address bits A3A2A1 that were allocated to it is inhibited.

In such a case, the memory circuit marked by its identifier is referenced as being not valid or faulty, that is to say the memory part as such does not function, and it is not possible to select such a memory circuit. The addressing of the non-valid memory part of the memory circuit is inhibited in read and/or write mode. It is then impossible to access its memory part when it is defective, neither for reading nor for writing.

The invention claimed is:

1. A method for making a stack of memory circuits, the method comprising a step of testing the validity of at least two memory circuits,
    wherein each memory circuit includes a respective configuration device for that memory circuit within the stack, and the method comprises a phase of configuring each memory circuit, the configuration phase comprising a step of writing, within the respective configuration device for the memory circuit, information relating to an identifier attributed to the memory circuit within the stack and information relating to a result of the validity test on the memory circuit.

2. A method according to claim 1, in which at least two memory circuits of the stack issue from at least two distinct wafers, each wafer comprising at least two memory circuits.

3. A method according to claim 2, in which the method comprises a phase of preparing each wafer, the preparation phase comprising a step of piercing each memory circuit, at the configuration device for the memory circuit.

4. A method according to claim 3, in which the step of piercing each memory circuit includes piercing, at its configuration device, at least one hole, at an input dedicated:
    to the information relating to the identifier attributed to the memory circuit within the stack, and
    to the information relating to the result of the validity test on the memory circuit.

5. A method according to claim 4, in which the piercing of the memory circuit at the configuration device depends on a rank of the memory circuit occupied within the stack.

6. A method according to claim 1, in which the method comprises a step of writing, within a predetermined memory address, of a memory circuit included within the stack and where the result of the validity test corresponds to a valid state, information relating to a total memory capacity in relation to the whole of the memory circuit or circuits included within the stack and where the individual result of the validity test corresponds to a valid state.

7. A method according to claim 2, in which the method comprises at least some of the phases belonging to the group comprising:
    a phase of superimposing memory circuits of at least two wafers in line with at least one hole formed within each memory circuit at the configuration device,
    a phase of fixing together said at least two wafers,
    a phase of filling, by means of an electrically conductive material, at least one hole formed within each memory circuit,
    a phase of cutting said at least two wafers, the cutting phase separating at least two stacks of memory circuits.

8. A method for addressing a memory circuit within a stack of memory circuits,
    wherein each memory circuit includes a respective configuration device for that memory circuit within the stack, and the method comprising:
    a step of comparing, at the respective configuration device for the memory circuit, address information with information relating to an identifier attributed to the memory circuit within the stack, and
    should the address information correspond to the information relating to the identifier attributed to the memory circuit, a step of reading information relating to a result of a validity test on the memory circuit.

9. A method according to claim 8, in which the method comprises, according to the information relating to the result of the validity test on the memory circuit, a step of enabling or inhibiting access to information stored within the memory circuit corresponding to the memory circuit identified by the identifier.

10. A stack of memory circuits comprising at least two memory circuits stacked on one another,
    wherein each memory circuit comprises a configuration device for the memory circuit within the stack, the configuration device comprising means for storing:
    information relating to an identifier attributed to the memory circuit within the stack, and
    information relating to a result of a validity test on the memory circuit.

11. A stack according to claim 10, in which the information relating to the identifier attributed to the memory circuit within the stack is coded in at least one additional address bit.

12. A stack according to claim 10, in which the information relating to the result of the validity test on the memory circuit is coded in at least one bit.

13. A stack according to claim 11, in which the configuration device comprises at least one input dedicated to the information relating to the identifier attributed to the memory circuit within the stack and to the information relating to the result of the validity test on the memory circuit.

14. A stack according to claim 13, in which the configuration device comprises a memory space of a state word,
    the memory space of the state word configured to store the information relating to the identifier attributed to the memory circuit within the stack and the information relating to the result of the validity test on the memory circuit.

15. A stack according to claim 13, in which the configuration device comprises at least two fuses, the number of fuses being equal to the number of bits necessary for coding the information relating to the identifier attributed to the memory circuit within the stack and the information relating to the result of the validity test on the memory circuit, wherein a conducting fuse corresponds to a predetermined bit value, and an open fuse corresponds to the other bit value.

16. A stack according to claim 10, in which each memory circuit in the stack comprises at least one address comparator with respect to the information relating to the identifier attributed to the memory circuit within the stack.

17. An electronic device comprising at least one memory block,
wherein said at least one memory block comprises at least one stack according to claim 10.

18. A stack according to claim 11, in which the information relating to the result of the validity test on the memory circuit is coded in at least one bit.

* * * * *